（12） United States Patent
Katoh

(10) Patent No.: US 8,904,327 B2
(45) Date of Patent: Dec. 2, 2014

(54) ASSISTING IN LOGIC CIRCUIT DESIGN TO PLACE CELLS ON AN IC SUBSTRATE AND OPTIMIZE WIRING

(71) Applicant: International Business Machines Corporation, Armonk, NY (US)

(72) Inventor: Yoshitaka Katoh, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/951,693

(22) Filed: Jul. 26, 2013

(65) Prior Publication Data

US 2014/0033153 A1     Jan. 30, 2014

(30) Foreign Application Priority Data

Jul. 26, 2012   (JP) ................................. 2012-165312

(51) Int. Cl.
*G06F 17/50* (2006.01)

(52) U.S. Cl.
CPC ........ *G06F 17/5072* (2013.01); *G06F 17/5081* (2013.01); *G06F 17/5077* (2013.01); *G06F 17/50* (2013.01)
USPC ........... 716/112; 716/124; 716/129; 716/130; 716/131

(58) Field of Classification Search
CPC ............ G06F 17/5072; G06F 17/5077; G06F 17/5081
USPC .......................... 716/112, 124, 129, 130, 131
See application file for complete search history.

(56) References Cited

U.S. PATENT DOCUMENTS

| | | | |
|---|---|---|---|
| 6,086,625 A | 7/2000 | Shouen | |
| 6,209,123 B1 * | 3/2001 | Maziasz et al. | 716/123 |
| 6,378,115 B1 | 4/2002 | Sakurai | |
| 6,519,749 B1 | 2/2003 | Chao et al. | |
| 6,543,039 B1 | 4/2003 | Watanabe et al. | |
| 6,912,704 B1 * | 6/2005 | Teig | 716/122 |
| 7,243,323 B2 | 7/2007 | Williams et al. | |
| 2002/0087940 A1 * | 7/2002 | Greidinger et al. | 716/2 |
| 2005/0097485 A1 * | 5/2005 | Guenthner et al. | 716/6 |
| 2005/0151258 A1 * | 7/2005 | Kotecha et al. | 257/758 |
| 2006/0156265 A1 * | 7/2006 | Tang | 716/10 |
| 2008/0046854 A1 * | 2/2008 | Tang | 716/10 |
| 2012/0036491 A1 * | 2/2012 | Ramji et al. | 716/122 |

FOREIGN PATENT DOCUMENTS

| | | |
|---|---|---|
| JP | 2648528 B2 | 3/1992 |
| JP | 06-309397 A1 | 11/1994 |

* cited by examiner

*Primary Examiner* — Phallaka Kik
(74) *Attorney, Agent, or Firm* — Anthony Canale; Roberts Mlotkowski Safran & Cole, P.C.

(57) ABSTRACT

A method of assisting in the design of a logic circuit enabling the placement and wiring of cells (logic operation elements) to be optimized on an IC substrate in a short period of time even when the logic circuit has multiple levels, to provide a device assisting in the design of a logic circuit using this method, and to provide a computer program executable by this device. The cells of all levels are placed in a placement area formed on a grid, and a port enabling connection to a cell in another level is placed in a boundary portion between the placement area having cells already placed and a placement area enabling placement of new cells. Cells in the same level are wired between cells and cells in another level are wired between a cell and a port so that the sum total of the wiring lengths may be minimized.

15 Claims, 13 Drawing Sheets

```
module chip_top (sig1, sig2, sig3, sig4);
...
BUFFER  u0 ( .A(sig1), .X(net1) );           ⎫
INVERT  u1 ( .A(sig2), .Y(net2) );            ⎬ 601
MAC0    u2 ( .IN1(net1), .IN2(net2), .OUT1(net3), .OUT2(net4) ); ⎭
...
MAC1    u5 ( .IN1(net5), .IN2(net6), .OUT1(net7), .OUT2(net8) );
//placement                    ⎫
u0 100, 100                     ⎪
u1 100, 200                     ⎬ 602
u2/IN1 200,130  ⎫               ⎪
u2/IN2 200, 160 ⎬ 610           ⎭
u5/IN1 300, 230 ──── 612
endmodule
```

```
module MAC0 ( IN1, IN2, OUT1, OUT2 )
... omitted ...                           ⎫
AND2  u1 ( .A(IN1), .B(IN2), .X(OUT2) );   ⎬ 603
//placement                                 ⎭
Port IN1 220,130  ⎫
Port IN2 200, 160 ⎬ 611      ⎫
u0 200, 100                   ⎬ 604
u1 200, 300                   ⎭
...
endmodule
```

```
module MAC1 ( IN1, IN2, OUT1, OUT2 )
... omitted ...                           ⎫
AND2  u1 ( .A(IN1), .B(IN2), .X(OUT2) );   ⎬ 605
//placement                                 ⎭
Port IN1 300, 230  ──── 613   ⎫
u0 300, 200                    ⎬ 606
...                            ⎭
endmodule
```

FIG. 6

ASSISTING IN LOGIC CIRCUIT DESIGN TO PLACE CELLS ON AN IC SUBSTRATE AND OPTIMIZE WIRING

BACKGROUND

The present invention relates to a method for assisting in the design of a logic circuit in the placement of cells on an IC substrate and in the optimization of wiring, a device for assisting in the design of a logic circuit using this method, and a computer program executable by this device.

When designing a complicated semiconductor integrated circuit, the logic circuit may have several levels. In order to simplify the logic design in the upper levels, the logic circuits in the lower levels can be black-boxed. The design of the levels is not expanded when the logic is designed. The levels are expanded when the wiring is verified, and are usually verified as logic circuits with a single-level structure. A typical design method of the prior art is disclosed in Japanese Patent No. 4,679,029. FIG. 11 is a diagram illustrating this logic circuit design method of the prior art.

As shown in FIG. 11(a), a logic circuit on which logic operation elements (cells) have been placed and wiring optimized has been realized on an IC substrate. In order to realize this, placement areas (blocks) are established for the placement of cells which are divided on a grid as shown in FIG. 11(b), and one cell is placed in each block corresponding to a portion of the grid. There are no particular restrictions on the algorithm used to place cells. The cells can be placed, for example, using the "Min-Cut" method.

Then, as shown in FIG. 11(c), the positions of the cells are adjusted to wire the placed cells and minimize the sum total of wire lengths or the overall wiring length. When designing a complicated semiconductor integrated circuit, the logic design is simplified by creating multiple levels of logic circuits and black-boxing the logic circuits on the lower levels. FIG. 12 is a diagram illustrating a level of a hierarchical logic circuit.

In the logic circuit MacA shown in FIG. 12(a), the designing method in FIG. 11 is used to establish placement areas (blocks) for the placement of cells as shown in FIG. 12 (b), and a cell is placed in each block. Then, the positions of the cells are adjusted to wire the placed cells and minimize the overall wiring length.

Next, logic circuit MacA is black-boxed and treated as a single cell in the design of the logic circuits in higher levels. FIG. 13 is a diagram illustrating a logic circuit design method for an upper level in which logic circuit MacA has been black-boxed.

As shown in FIG. 13(a), logic circuit MacA is black-boxed, and treated as a single cell. A single cell is then placed in each block as shown in FIG. 13(b). In this way, the types and number of logic operation elements (cells) handled at this point in the logic design can be reduced, the resources required to place and wire cells are reduced, and a logic circuit can be designed more efficiently.

SUMMARY

A logic circuit can be designed without being aware of the hierarchy, even when a logic circuit has multiple levels in order to simplify the logic design and the logic circuits in the lower levels have been black-boxed. However, because the physical constraints are great and the degree of freedom for cell placement is reduced, the size of the IC substrate may have to be increased.

Also, because the configuration of the black-boxed logic circuits cannot be checked at the time of design, it is difficult to verify whether the inter-cell wiring is correct. Often, the hierarchy is expanded when the logic design has been completed, and then verified as logic circuits with a single-level structure. While the logic compression and timing design are easier, the inter-cell wiring of all cells has to be verified when the logic design is completed, and the verification process requires a considerable amount of time.

In light of this situation, the purpose of the invention is to provide a method assisting in the design of a logic circuit enabling the placement and wiring of cells (logic operation elements) to be optimized on an IC substrate in a short period of time even when the logic circuit has multiple levels, to provide a device assisting in the design of a logic circuit using this method, and to provide a computer program executable by this device.

In order to achieve this purpose, a first aspect of the invention is a wiring method executable by a device for assisting in the design of a logic circuit having a plurality of levels and able to minimize the sum total of wire lengths, in which the method includes the steps of: placing the cells of all levels in a placement area formed on a grid; placing a port enabling connection to a cell in another level in a boundary portion between the placement area having cells already placed and a placement area enabling placement of new cells; and wiring cells in the same level between cells and wiring cells in another level between a cell and a port.

A second aspect of the invention is the method of the first aspect, in which the placement area having cells already placed is stored as an area not enabling placement of new cells.

A third aspect of the invention is the method of the first aspect or the second aspect, in which the process for placing and wiring cells and ports in each level can exchange data with other processes via inter-process communication, and the method determines whether or not the placement area for placement of cells in a given level is a placement area enabling placement of new cells, based on whether or not there is a process for placing cells in the same placement area.

In order to achieve this purpose, a fourth aspect of the invention is a device for assisting in the design of a logic circuit having a plurality of levels including: placement means for placing cells of all levels in a placement area formed on a grid; port placing means for placing a port enabling connection to a cell in another level in a boundary portion between the placement area having cells already placed and a placement area enabling placement of new cells; and wiring means for wiring cells in the same level between cells and wiring cells in another level between a cell and a port, the wiring means wiring so that the sum total of the wiring lengths may be minimized.

A fifth aspect of the invention is the device of the fourth aspect, in which the placement area having cells already placed is stored as an area not enabling placement of new cells.

A sixth aspect of the invention is the device of the fourth aspect or the fifth aspect, in which the process for placing and wiring cells and ports in each level can exchange data with other processes via inter-process communication, and determines whether or not the placement area for placement of cells in a given level is a placement area enabling placement of new cells, based on whether or not there is a process for placing cells in the same placement area.

In order to achieve this purpose, a seventh aspect of the invention is a computer program executable by a device for assisting in the design of a logic circuit having a plurality of levels, in which the computer program enables the device to function as: placement means for placing cells of all levels in a placement area formed on a grid; port placing means for placing a port enabling connection to a cell in another level in a boundary portion between the placement area having cells already placed and a placement area enabling placement of new cells; and wiring means for wiring cells in the same level between cells and wiring cells in another level between a cell and a port, the wiring means wiring so that the sum total of the wiring lengths may be minimized.

An eighth aspect of the invention is the computer program of the seventh aspect, in which the computer program enables the device to function as a means for storing a placement area having cells already placed as an area not enabling placement of new cells.

A ninth aspect of the invention is the computer program of the seventh aspect or the eighth aspect, in which the process for placing and wiring cells and ports in each level can exchange data with other processes via inter-process communication in the device, and the computer program enables the device to function as a means for determining whether or not the placement area for placement of cells in a given level is a placement area enabling placement of new cells, based on whether or not there is a process for placing cells in the same placement area.

According to various embodiments of the invention, the overall wiring length or the sum total of all wiring lengths can be minimized by grasping the placement cells in a given level and the placement of ports enabling connection to cells in another level. The placement of cells in all levels does not need to be grasped, even when a logic circuit has multiple levels in order to simplify the logic design and the logic circuits in the lower levels have been black-boxed. As a result, the size of the IC substrate does not have to be increased due to physical constraints, and it is not necessary to verify the inter-cell wiring of all cells. The time required to perform the verification step can be reduced, and a logic circuit can be designed in less time.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 6 is a diagram illustrating a netlist generated after determining the wiring for the upper level in a logic circuit design assistance device according to an embodiment of the invention.

DETAILED DESCRIPTION

Figure 1:
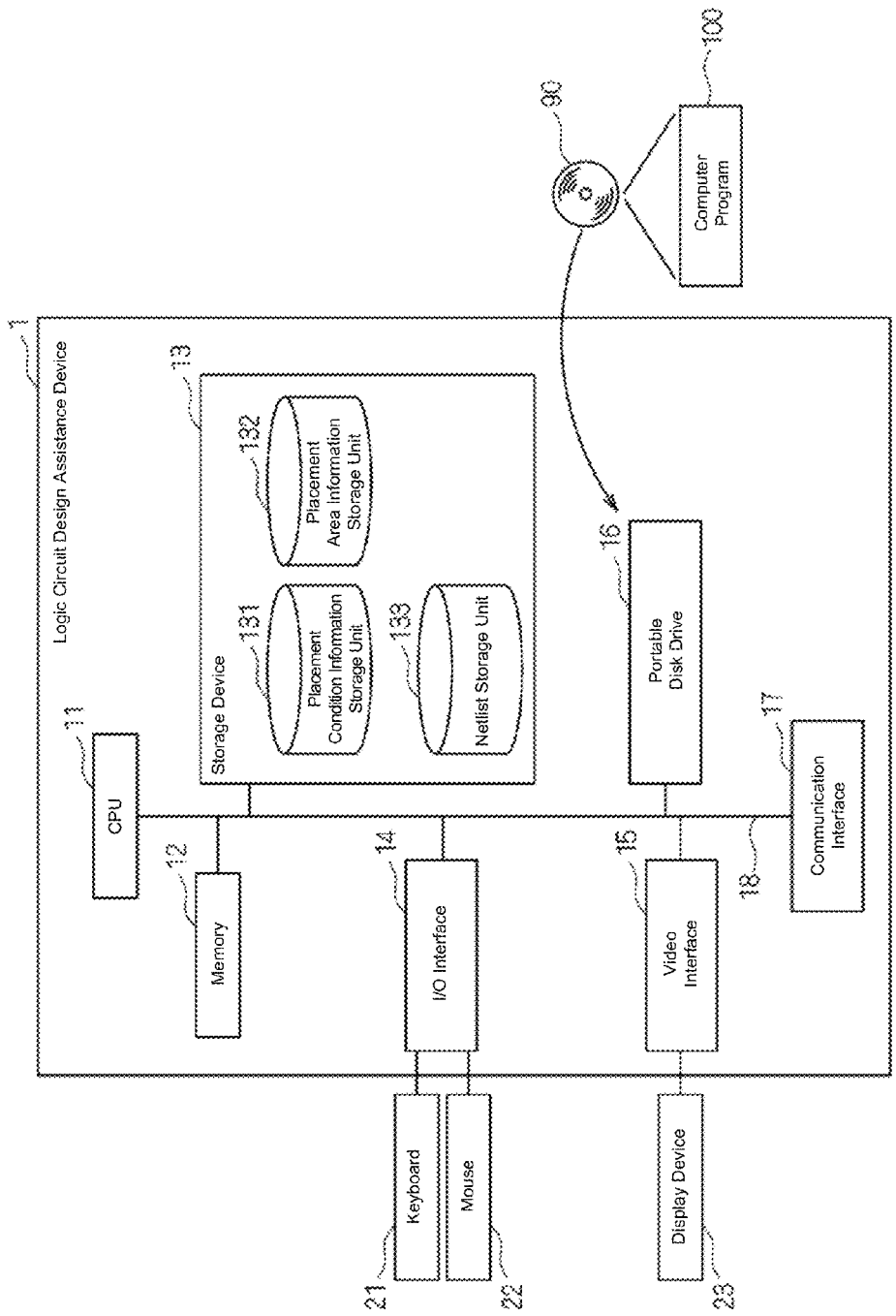
FIG. 1 is a block diagram schematically illustrating the configuration of a logic circuit design assistance device according to an embodiment of the invention.

The following is an explanation with reference to the drawings of a logic circuit design assistance device in an embodiment of the invention which assists in the design of a logic circuit. However, the present embodiment of the invention does not limit the invention in the scope of the claims. Also, all combinations of characteristics explained in the embodiment are not necessarily required in the technical solution of the invention.

The invention can be embodied in many ways, and should not be construed as limited to the description of a particular embodiment. Identical elements are denoted by the same reference numerals throughout the description of the various embodiments of the invention.

In the following explanation of embodiments of the invention, a device is used to introduce a computer program to a computer system. However, as should be clear to those skilled in the art, some embodiments of the invention can be embodied as a computer program that can be executed by a computer. Therefore, the invention can be embodied as hardware, such as a logic circuit design assistance device for assisting in the design of a logic circuit, as software, or as a combination of hardware and software. The computer program can be stored on a computer-readable storage device such as a hard disk, DVD, CD, optical storage device, or magnetic storage device.

According to an embodiment of the invention, the overall wiring length or the sum total of all wiring lengths can be minimized in a logic circuit design by grasping the placement cells in a given level and the placement of ports enabling connection to cells in another level. The placement of cells in all levels does not need to be grasped, even when a logic circuit has multiple levels in order to simplify the logic design and the logic circuits in the lower levels have been black-boxed. As a result, the size of the IC substrate does not have to be increased due to physical constraints, and it is not necessary to verify the inter-cell wiring of all cells. The time required to perform the verification step can be reduced, and a logic circuit can be designed in less time.

According to an embodiment of the invention, FIG. 1 is a block diagram schematically illustrating the configuration of the logic circuit design assistance device. The logic circuit design assistance device 1 includes, at the very least, a central processing unit (CPU) 11, memory 12, a storage device 13, an I/O interface 14, a video interface 15, a portable disk drive 16, a communication interface 17, and an internal bus 18 connecting these hardware components.

The CPU 11 is connected to each hardware component in the logic circuit design assistance device 1 via an internal bus 18 in order to control the operations of these hardware components, and to execute various software functions in accordance with a computer program 100 stored in the storage device 13. The memory 12 is non-volatile memory such as SRAM or SDRAM. When the computer program 100 is executed, the load module is deployed in the memory, and the temporary data generated when the computer program 100 has been executed is stored in the memory.

The storage device 13 can be an internal fixed storage device (hard disk) or ROM. The computer program 100 stored in the storage device 13 is downloaded from a portable storage medium 90 such as a DVD or CD-ROM containing information such as programs and data using a portable disk drive 16, and is deployed from the storage device 13 and executed in the memory 12. It may, of course, be a computer program downloaded from an external computer connected via a communication interface 17.

The storage device 13 includes a placement condition information storage unit 131 for storing information related to the placement conditions for cells (logic operation elements), a placement area information storage unit 132 for storing information related to placement areas for cells, and a netlist storage unit 133 for storing netlists including information related to wiring. The information related to the storage conditions for cells that is stored in the placement condition information storage unit 131 includes, for example, types of cells such as AND circuits and OR circuits, the coordinates of ports that can be connected to cells on other levels, and the size of the cell (size: x-by-y in the case of a rectangle).

The placement area information storage unit 132 stores information related to the placement areas for cells (for example, areas in which a grid pattern has been formed on the surface of an IC substrate). The netlist storage unit 133 stores netlists including information related to wiring. The netlists may include information related to the placement of cells and ports in addition to information related to wiring.

The communication interface 17 is connected to the internal bus 18, and to an external network such as the Internet, a LAN or a WAN so as to be able to exchange data with external computers.

The I/O interface 14 is connected to input devices such as a keyboard 21 and a mouse 22 in order to receive the input of data. The video interface 15 is connected to a display device 23 such as a CRT display or a liquid crystal display to display predetermined images.

Figure 2:
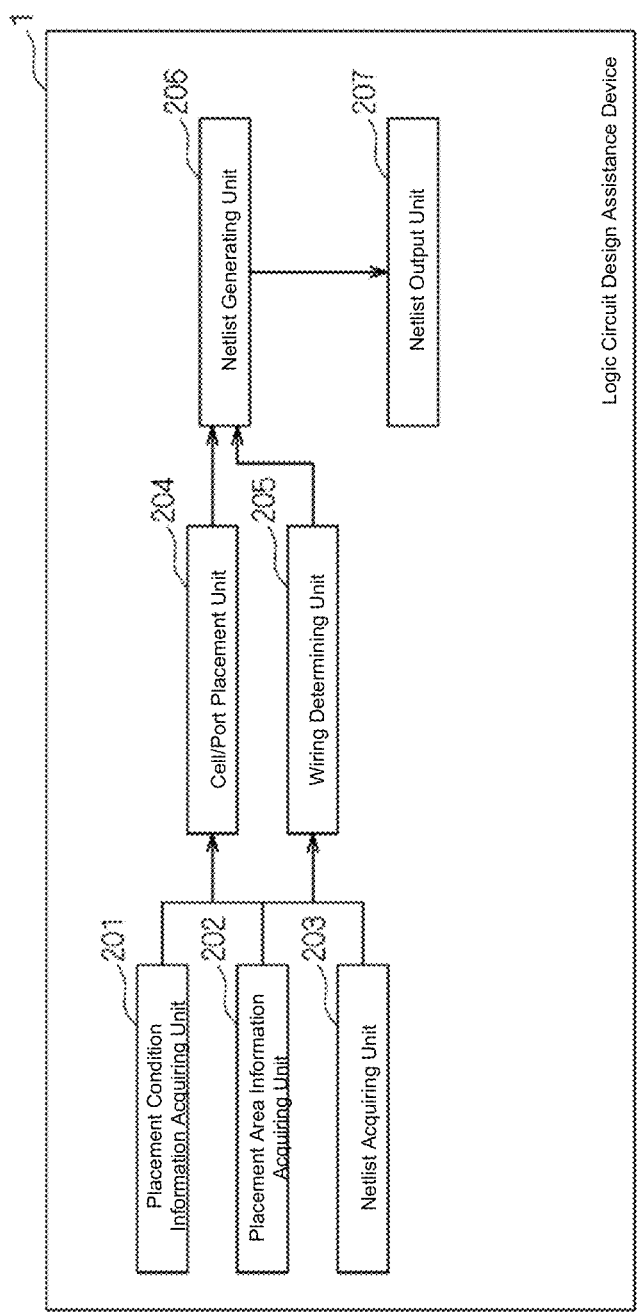
FIG. 2 is a function block diagram of a logic circuit design assistance device according to an embodiment of the invention.

FIG. 2 is a function block diagram of a logic circuit design assistance device 1. In FIG. 2, the placement conditions information acquiring unit 201 in the logic circuit design assistance device 1 acquires information related to the placement conditions for cells. More specifically, the placement condition information storage unit 131 is queried on the cell to be placed, and information such as the type of cell to be placed (for example, AND circuit, OR circuit, etc.), the coordinates of ports that can be connected to cells on other levels, and the size of the cell (size: x-by-y in the case of a rectangle) is retrieved.

The placement area information acquiring unit 202 acquires information related to the placement area of cells. A placement area for a cell can be, for example, one of the areas in a grid pattern formed on the surface of an IC substrate. This is a candidate for cell placement. The placement area information storage unit 132 stores placement areas in which cells have already been placed on other levels as areas (blocked-out areas) in which new cells cannot be placed. This prevents the placement of overlapping cells in the same area.

Figure 3:
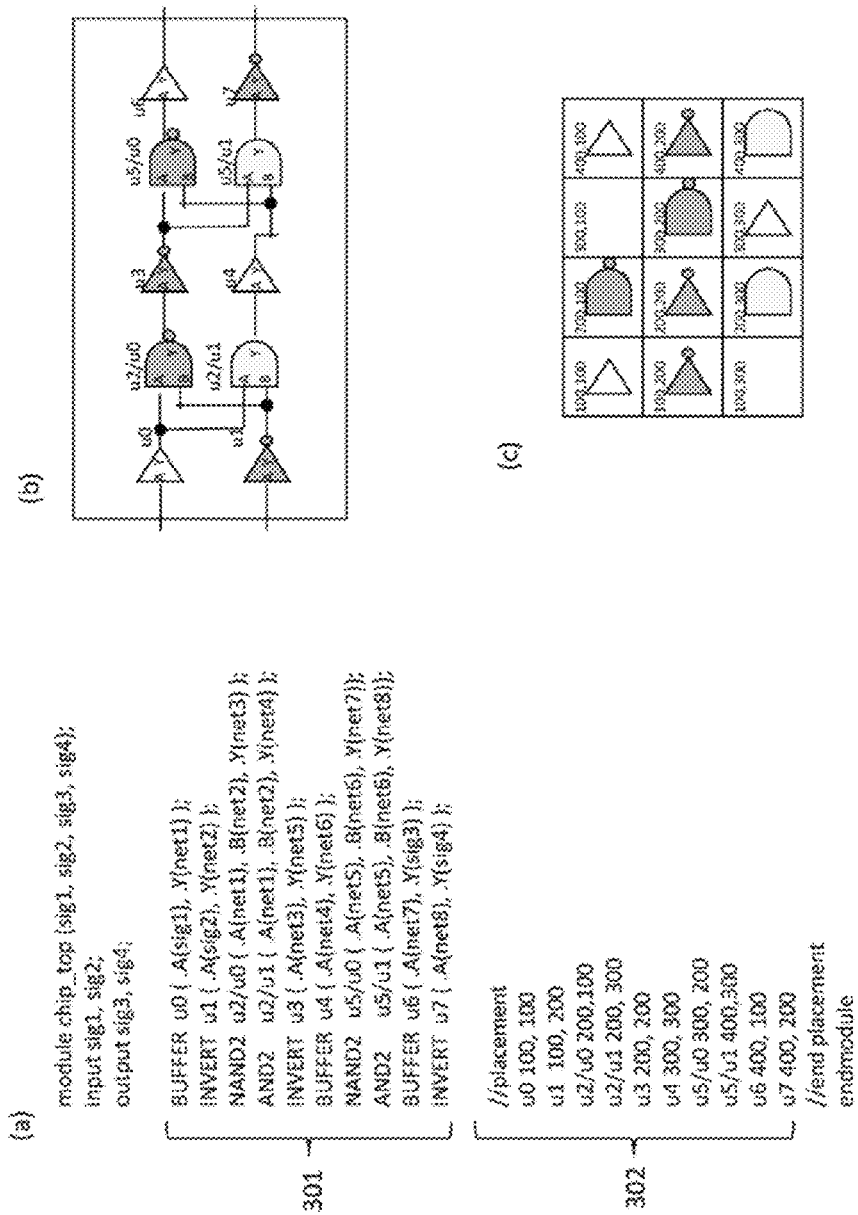
FIG. 3 is a diagram illustrating a netlist of a logic circuit design assistance device according to an embodiment of the invention.

The netlist acquiring unit 203 acquires a netlist including information related to wiring. FIG. 3 is a diagram illustrating a netlist of a logic circuit design assistance device 1. The netlist shown in FIG. 3(a) includes a connection information portion 301 indicating the connections between cells in the logic circuit shown in FIG. 3(b), and a wiring portion 302 indicating the cell wiring shown in FIG. 3(c). Of course, there is only a connection information portion 301 prior to the placement of the first cell.

In the netlist shown in FIG. 3(a), u0 through u7 indicate cell IDs. In the connection information portion 301, BUFFER, INVERT, etc. written in front of the cell IDs indicate the type of cell. Also, the wiring between cells is described as the connection destinations on the input end and the output end. For example, the wiring for cells u2/u0 is described in terminal (wiring) format in which the input ends are A(net1), B(net2), and the output end is Y(net3). In the placement portion 302, the numbers mentioned after the cell ID are the coordinates of the placement area in which the cell has been placed. For example, "u0 100, 100" means cell u0 has been placed in the placement area with coordinates (100, 100).

Returning to FIG. 2, the cell/port placement unit (placement means, port placement means) 204 places cells in the grid-like placement areas (cell placement areas) of each level, and places ports able to connect to cells placed in other levels. Because only cells are placed in the prior art, the placement of cells on all of the levels of a multiple-level logic circuit has to be grasped in order to minimize the overall wiring length. However, only the placement of cells and ports on a single level has to be grasped. Because the ports are placed as virtual objects without any surface area in the boundary portions between placement areas already including cells and placement areas in which new cells can be placed, the ports do not interfere with the placement of cells, and the logic circuit can be designed simply by grasping the placement of the ports instead of the placement of cells on all levels.

The placement area information storage unit 132 stores placement areas already including cells on other levels as areas (blocked-out areas) in which new cells cannot be placed. When cells are placed in descending order from the top level, the number of blocked-out areas increases on lower levels, and the degree of design freedom with respect to cell placement decreases.

Figure 4:
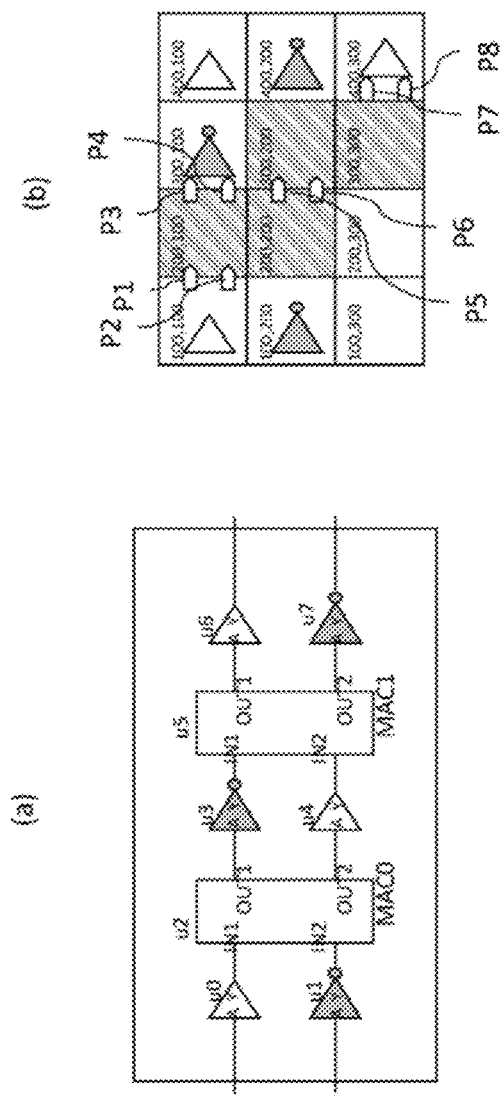
FIG. 4 is a diagram illustrating the blocked-out areas of a logic circuit design assistance device according to an embodiment of the invention.

FIG. 4 is a diagram illustrating the blocked-out areas of a logic circuit design assistance device 1. When designing a two-level logic circuit as shown in FIG. 4(a), logic circuits MAC0 and MAC1 on the lower level are handled as cells u2 and u5, respectively when creating a logic design for the upper level.

In FIG. 4(b), placement areas on the lower level which already include cells (the placement areas including the cells constituting logic circuit MAC0 and logic circuit MAC1) are displayed with cross-hatching indicating that they are blocked-out areas. New cells cannot be placed in these areas when creating a logic design for the upper level. Ports P1-P8 for connecting logic circuit MAC0 and logic circuit MAC1 to cells on the other level are placed in the boundary portions between the blocked-out areas and placement areas in which new cells can be placed.

Returning to FIG. 2, the wiring determining unit 205 determines the wiring between cells and the wiring between cells and ports. The wiring combination with the shortest overall wiring length is selected. Cells are connected to other cells on the same level, and ports are connected to cells on the other level. In this way, the wiring can be determined without having to grasp the placement of cells on the other level, and using the same method for single-level wiring used in the prior art.

Figure 5:
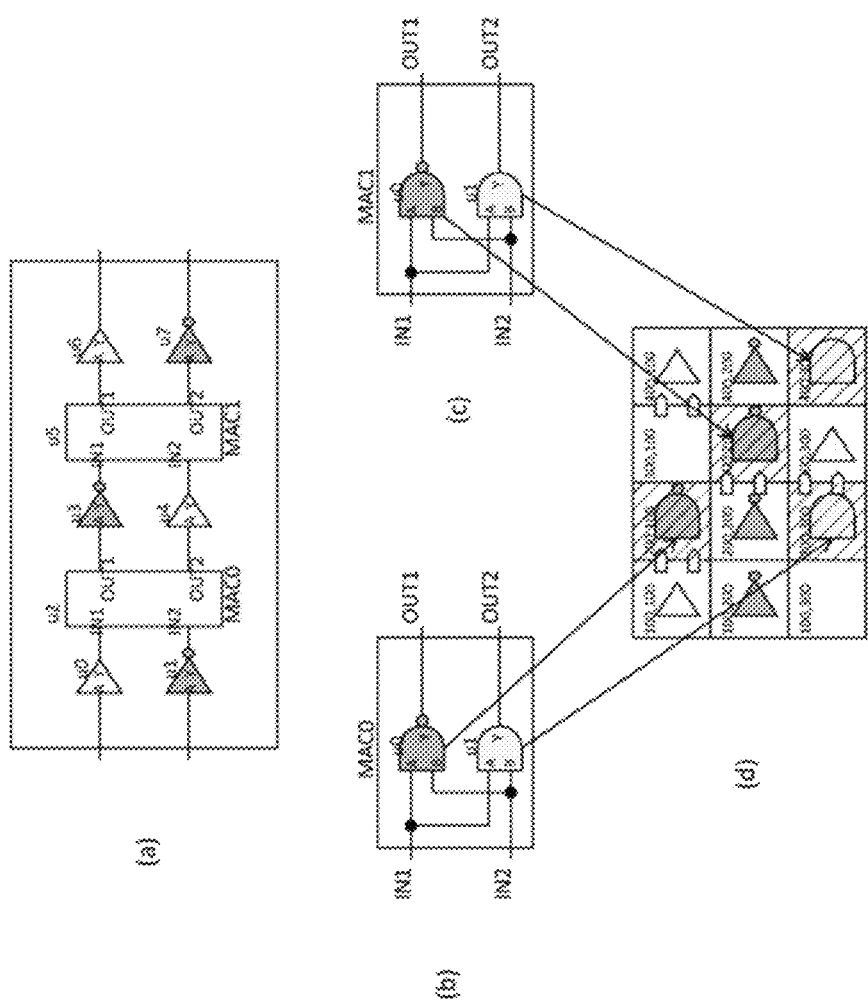
FIG. 5 is a diagram illustrating logic circuit wiring by a logic circuit design assistance device according to an embodiment of the invention.

The netlist generating unit 206 generates a netlist including information related to wiring and information related to placement. A netlist is generated each time the information related to wiring and the information related to placement is updated. FIG. 5 is a diagram illustrating logic circuit wiring by a logic circuit design assistance device 1. FIG. 6 is a diagram illustrating a netlist generated after determining the wiring for the upper level in a logic circuit design assistance device 1.

The logic circuit shown in FIG. 5 has two levels. FIG. 5(a) shows the logic circuit diagram for the upper level, and FIG. 5(b) and FIG. 5(c) show the logic circuit diagrams for logic circuit MAC0 and logic circuit MAC1, respectively, in the cells of the lower level. The cells constituting logic circuits MAC0 and MAC1 are arranged in the cross-hatched portions shown in FIG. 5(d).

Unlike FIG. 3, the netlist shown in FIG. 6 includes information related to wiring and information related to placement on three levels. In other words, in addition to a connection information section 601 indicating the connections between cells on the uppermost level and connections to ports on a lower level, and in addition to a placement section 602 indicating the placement of cells and ports in the uppermost level, there are connection information sections 603, 605 and placement sections 604, 606 for the two lower levels.

The coordinates for the placed ports are written in the placement sections 602, 604, 606 of each level. For example, the coordinates of ports IN1, IN2 for cell u2 are written in port subsection 610, and the coordinates of port IN1 for cell u5 are written in port subsection 612 of the placement section 602 for the uppermost level.

Similarly, the coordinates of ports IN1, IN2 for cell u2 are written, along with parameter "Port" indicating a port, in port subsection 611, and the coordinates of port IN1 for cell u5 are written in port subsection 613 of the placement section 605 for a lower level. The coordinates of port IN1 for cell u5 are written in port subsection 613 of the placement section 606 for the other lower level. The coordinates for the ports added to the netlist are all the same when referring to the same port.

The netlist output unit 207 outputs a generated netlist. In this way, the inter-cell wiring for all cells does not have to be verified, and the verification process does not require a considerable amount of time.

Figure 7:
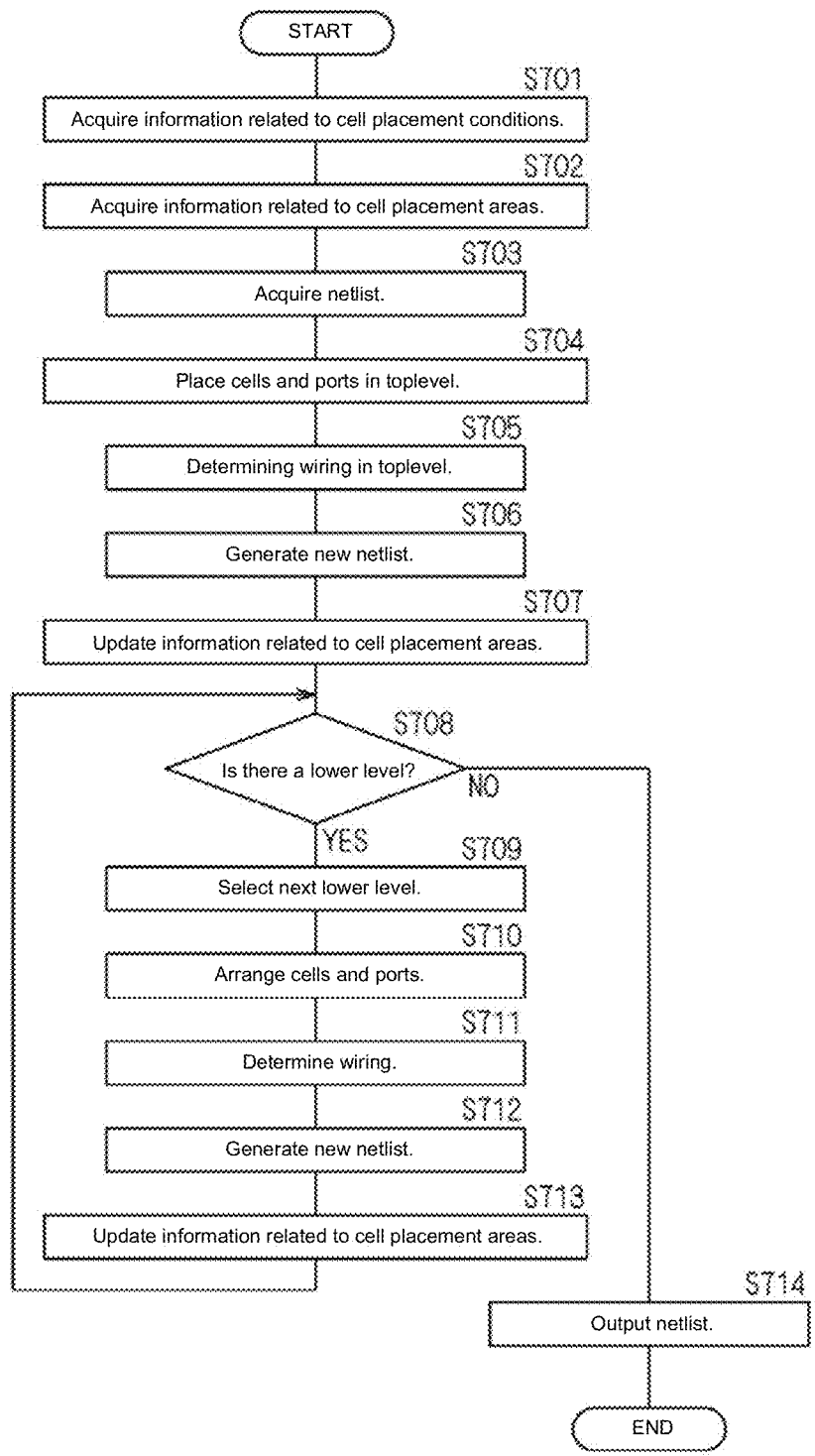
FIG. 7 is a flowchart of processing steps performed by the CPU in a logic circuit design assistance device according to an embodiment of the invention.

FIG. 7 is a flowchart of processing steps performed by the CPU 11 in a logic circuit design assistance device 1. The CPU 11 in the logic circuit design assistance device 1 acquires information related to cell placement conditions (Step S701) and then acquires information related to cell placement areas (Step S702). The retrieved information related to the cell placement conditions can include, for example, types of cells to be placed, the coordinates of ports that can be connected to cells on other levels (relative position to cells, not absolute coordinates), and the size of the cell (size: x-by-y in the case of a rectangle). The information related to cell placement areas includes information related to areas in which new cells cannot be placed (blocked-out areas).

The CPU 11 acquires a netlist including information related to wiring and information related to placement (Step S703), and places cells in the grid-like placement areas of the uppermost level and places ports that can be connected to cells in other levels (Step S704). The CPU 11 then determines the wiring between cells on the uppermost level (Step S705). The wiring arrangement with the shortest overall wiring length is selected.

The CPU 11 generates a new netlist including information related to the wiring and information related to placement in the uppermost level (Step S706). The generated netlist can have a configuration similar to the netlist shown in FIG. 6. The CPU 11 updates the information related to cell placement areas stored in the placement area information storage unit 132 (Step S707). More specifically, the placement areas already including cells in the uppermost level are stored as areas in which new cells cannot be placed (blocked-out areas).

CPU 11 determines whether or not there is a lower level (Step S708). When the CPU 11 determines that there is a lower level (Step S708: YES), the CPU 11 selects the lower level (Step S709), places cells and ports in the selected level in the same manner as the uppermost level (Step S710), and determines the wiring (Step S711). Cells in the same level are connected, and ports are connected to cells in other levels. In this way, the wiring can be determined without having to grasp the placement of cells on the other level, and using the same method for single-level wiring used in the prior art. The CPU 11 generates a netlist including information related to wiring and information related to placement in the selected level (Step S712), and updates the information related to cell placement areas stored in the placement area information storage unit 132 (Step S713). The process returns to Step S708, and then proceeds to processing the next lower level.

When the CPU 11 determines there is no lower level (Step S708: NO), the CPU 11 determines that the logic design process for the lowest level has been completed, outputs the netlist (Step S714), and ends the process. In this way, inter-cell wiring can be verified for all cells.

The overall wiring length or the sum total of all wiring lengths can be minimized in a logic circuit design by grasping the placement cells in a given level and the placement of ports enabling connection to cells in another level. The placement of cells in all levels does not need to be grasped, even when a logic circuit has multiple levels in order to simplify the logic design and the logic circuits in the lower levels have been black-boxed. As a result, the size of the IC substrate does not have to be increased due to physical constraints, and it is not necessary to verify the inter-cell wiring of all cells. The time required to perform the verification step can be reduced, and a logic circuit can be designed in less time.

The logic design was created in descending order from the uppermost level. However, the invention is not restricted to a logic design created in descending order from the uppermost level. A logic design can be created in ascending order from the lowest level.

According to another embodiment of the invention, the process of placing and wiring cells and ports in each level is performed separately but concurrently as described herein below.

Figure 8:
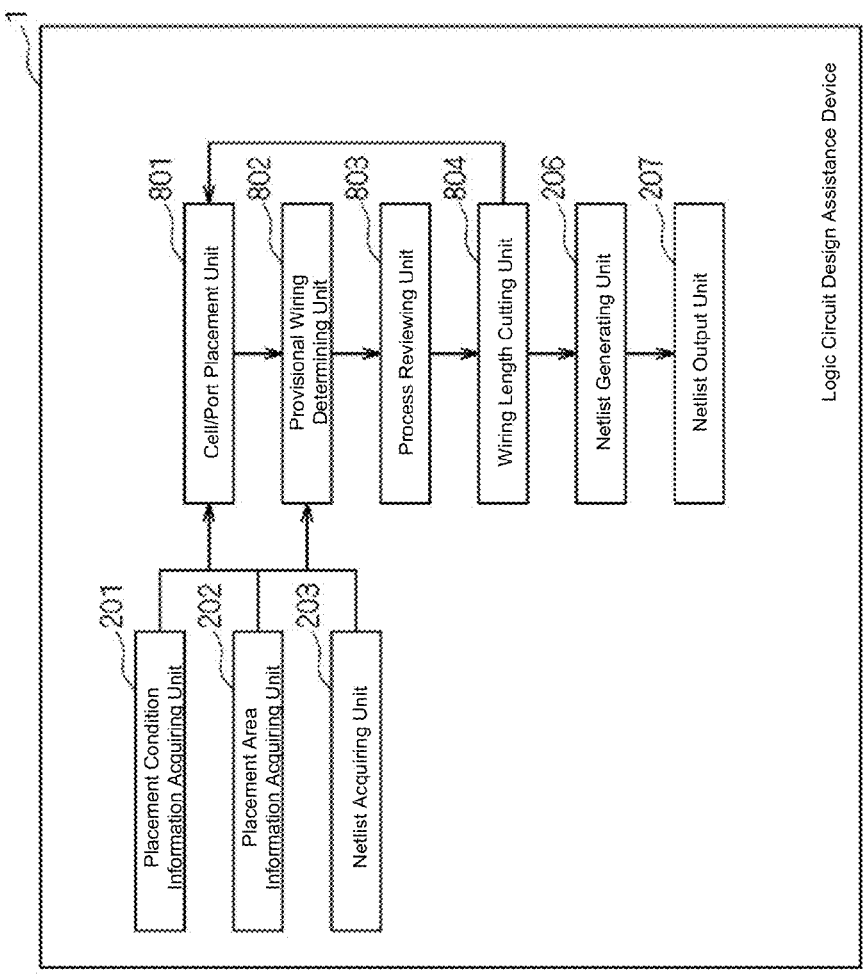
FIG. 8 is a function block diagram of a logic circuit design assistance device according to another embodiment of the invention.

FIG. 8 is a function block diagram of a logic circuit design assistance device 1. In FIG. 8, the logic circuit design assistance device 1 has a placement conditions information acquiring unit 201, a placement area information acquiring unit 202, and a netlist acquiring unit 203. Because these units are identical to those previously described herein above, further explanation of these units has been omitted.

The cell/port placement unit (placement means, port placement means) 801 places cells in the grid-like placement areas (cell placement areas) of each level, and places ports able to connect to cells placed in other levels. Because only cells are placed in the prior art, the placement of cells on all of the levels of a multiple-level logic circuit has to be grasped in order to minimize the overall wiring length. However, only the placement of cells and ports on a single level has to be grasped. Because the ports are placed as virtual objects without any surface area in the boundary portions between placement areas already including cells and placement areas in which new cells can be placed, the ports do not interfere with the placement of cells, and the logic circuit can be designed simply by grasping the placement of the ports instead of the placement of cells on all levels.

The provisional wiring determining unit 802 provisionally determines the wiring between cells and the wiring between cells and ports. The blocked-out areas are unknown, therefore, cell placement has to be verified when the provisional wiring is determined.

The process reviewing unit 803 exchanges data with the processes placing and wiring the cells and ports in each level, and determines whether or not a cell placement area in a given level is a placement area in which a new cell can be placed. More specifically, it exchanges data with the processes to determine whether or not the processes have placed a cell in the same placement area.

When the processes have placed a cell in the same placement area, the cell placement with the shorter overall wiring length is given precedence. More specifically, when the provisional wiring determining unit 802 has provisionally determined the wiring, the overall wiring length is calculated. It then determines whether or not to change the cell placement by comparing this to the overall wiring length when the placement of a reviewed process has been given precedence.

The wiring length cutting unit 804 compares the overall wiring length of the provisionally determined wiring to the overall wiring length when the placement of a reviewed process has been given precedence to determine which is shorter. When the overall wiring length of the placement of the reviewed process given precedence is shorter, the placement of cells is changed by the cell/port placement unit (placement means, port placement means) 801, and this cell placement is again verified by communication between processes.

When the overall wiring length of the provisionally determined wiring is determined to be shorter, the current placement and wiring is accepted, a netlist including information related to wiring and information related to placement is generated by the netlist generating unit 206, and the generated netlist is outputted by the netlist output unit 207.

Figure 9:
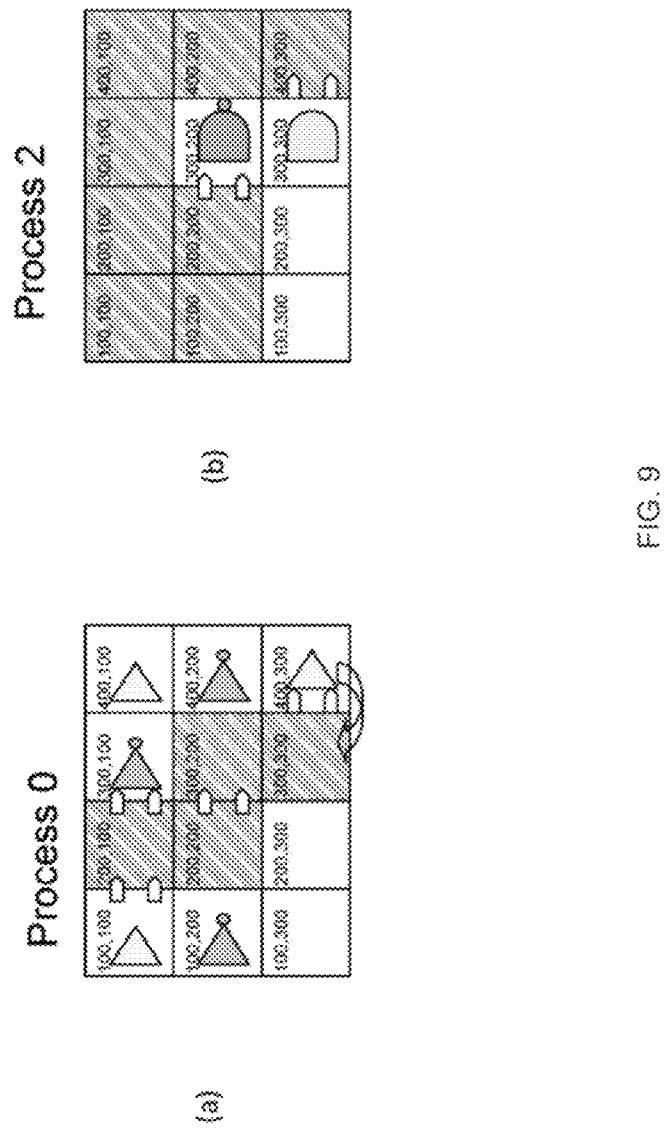
FIG. 9 is a diagram illustrating the cell placement verification process via inter-process communication in a logic circuit design assistance device according to another embodiment of the invention.

FIG. 9 is a diagram illustrating the cell placement verification process via inter-process communication in a logic circuit design assistance device 1. FIG. 9(*a*) shows the cell placement by process 0, and FIG. 9(*b*) shows the cell placement by process 2.

Here, when the cell placed at coordinates (400, 300) in FIG. 9(*a*) is moved to coordinates (300, 300), process 0 verifies whether any other process has placed a cell at coordinates (300, 300). Because process 2 has placed a cell at coordinates (300, 300), as shown in FIG. 9(*b*), it responds.

The overall wiring length of the cell placement by process 0 including a cell placed at coordinates (300, 300) is compared to the overall wiring length of the cell placement by process 2. When the overall wiring length of the cell placement by process 2 is shorter, process 2 refuses to change the placement of the cell. When the overall wiring length of the cell placement by process 0 is shorter, process 2 vacates coordinates (300, 300), and process 0 moves the cell placed at coordinates (400, 300) to coordinates (300, 300).

Figure 10:
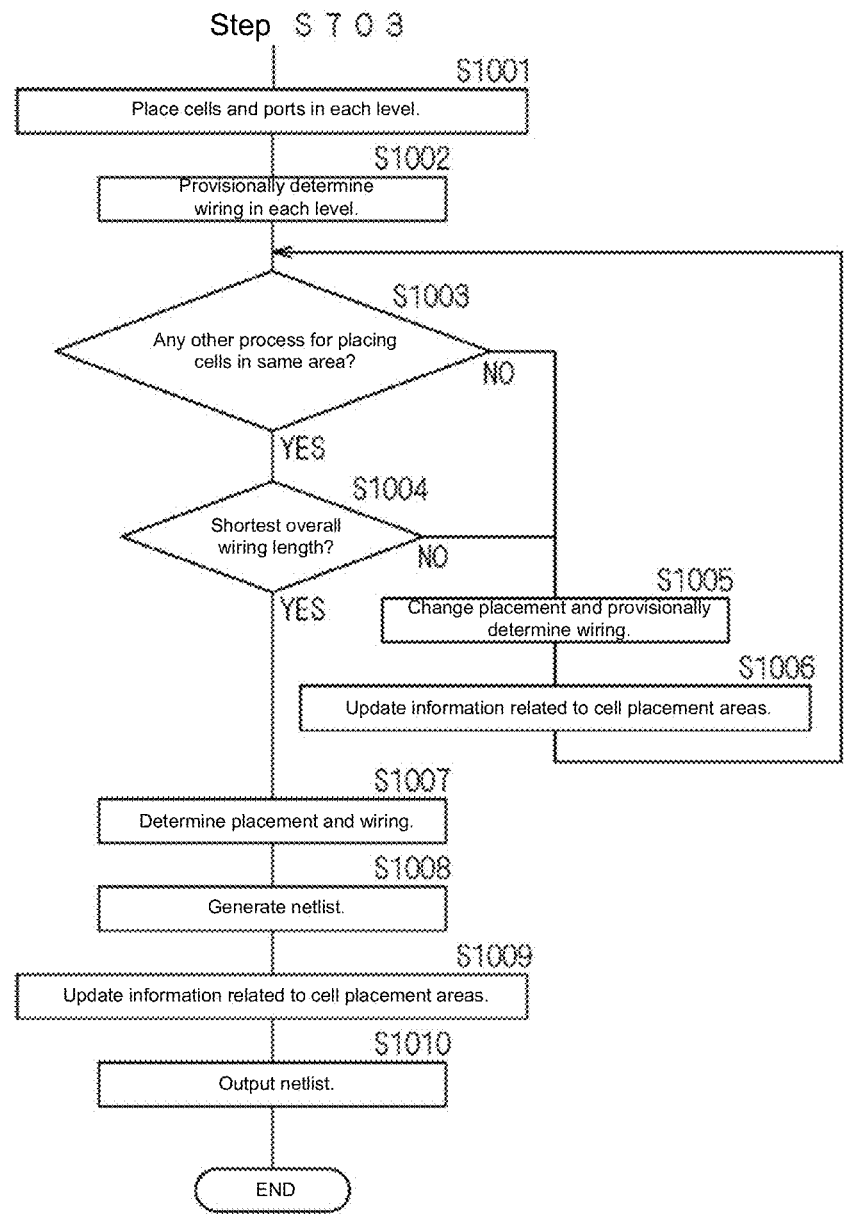
FIG. 10 is a flowchart of processing steps performed by the CPU in a logic circuit design assistance device according to another embodiment of the invention.
Figure 11:
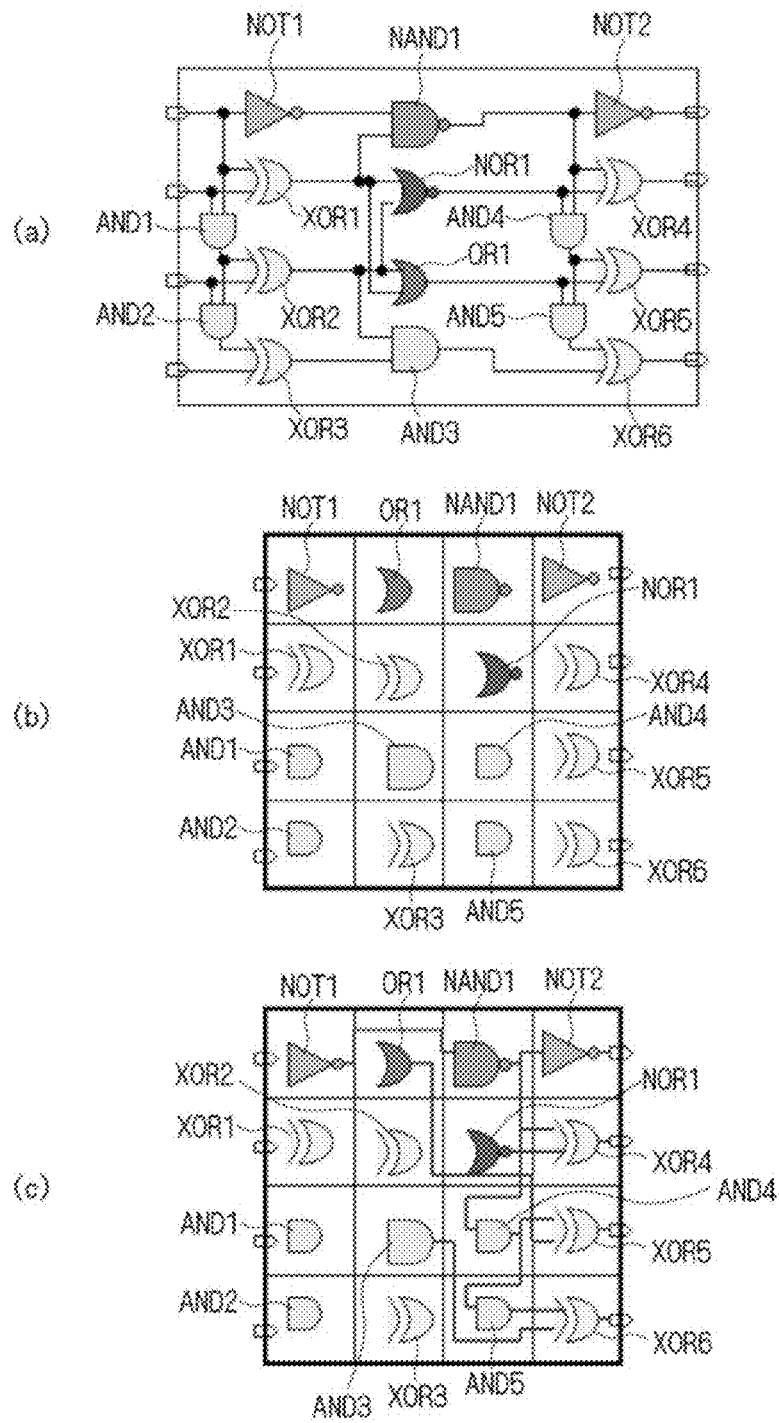
FIG. 11 is a diagram illustrating a logic circuit design method of the prior art.
Figure 12:
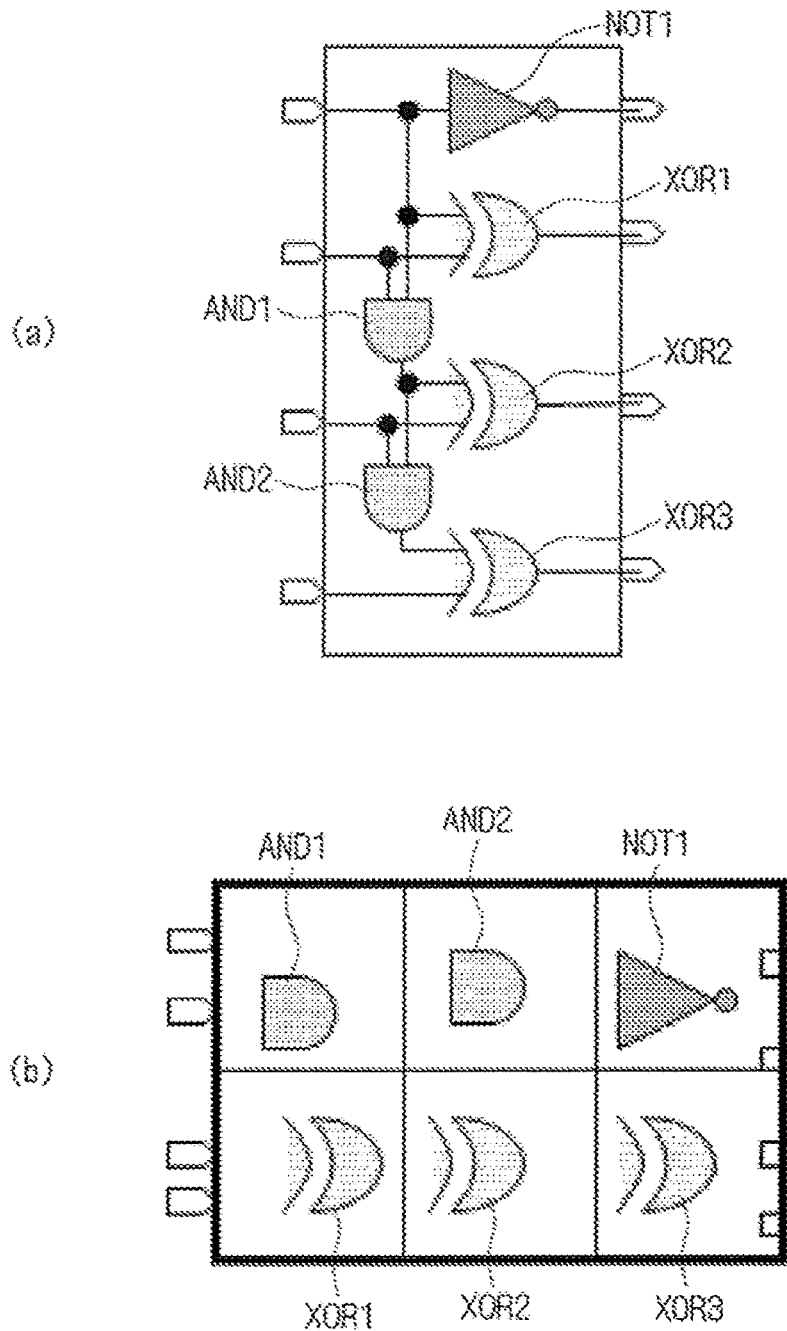
FIG. 12 is a diagram illustrating a level of a hierarchical logic circuit.
Figure 13:
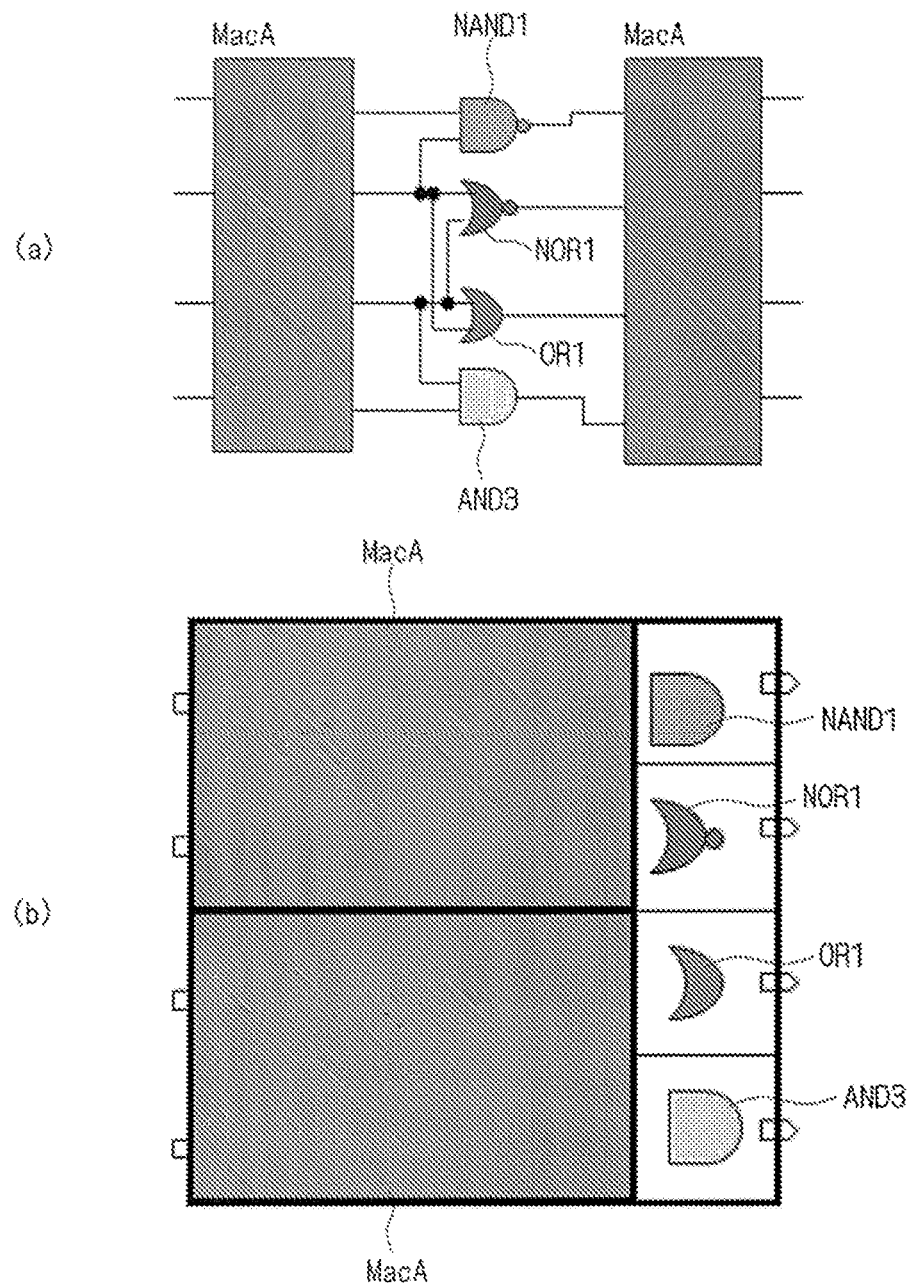
FIG. 13 is a diagram illustrating a logic circuit design method for an upper level in which logic circuit MacA has been black-boxed.

FIG. 10 is a flowchart of processing steps performed by the CPU 11 in a logic circuit design assistance device 1. Because the process performed by the CPU 11 in the logic circuit design assistance device 1 is the same as that previously described herein above up to Step S703, further explanation has been omitted. The CPU 11 acquires a netlist including information related to wiring and information related to placement (Step S703), and places cells in the grid-like placement areas of the each level and places ports that can be connected to cells in other levels (Step S1001).

The CPU 11 provisionally determines the wiring between cells and between cells and ports (Step S1002), and then determines whether any other process has placed cells in the same cell areas (Step S1003). More specifically, it communicates with processes placing and wiring cells and ports in each level, and awaits a response from any process that has placed cells at the same coordinates.

When the CPU 11 has determined that process has placed a cell in the same cell area (Step S1003: YES), the CPU 11 compares the overall wiring length of the provisionally determined wiring to the overall wiring length in the placement of a reviewed process which has been given precedence to determine which is shorter (Step 1004). When the CPU 11 has determined that no process has placed a cell in the same cell area (Step S1003: NO), or that the overall wiring length of the provisionally determined wiring is not shortest, that is, there is a process with a shorter overall wiring length (Step S1004: NO), the CPU 11 changes the cell placement, provisionally determines the wiring (Step S1005), updates the information related to cell placement areas stored in the placement area information storage unit 132 (Step S1006), and returns to Step S1003 to repeat the process.

When the CPU 11 has determined that the overall wiring length of the provisionally determined wiring is the shortest, that is, there is no process with a shorter overall wiring length (Step S1004: YES), the CPU 11 accepts the current placement and wiring (Step S1007), and generates a netlist including information related to wiring and information related to placement (Step S1008). A netlist can be generated, for example, with the same configuration as the netlist shown in FIG. 6. The CPU 11 updates the information related to cell placement stored in the placement area information storage unit 132 (Step S1009), and outputs the netlist (Step 1010).

The overall wiring length or the sum total of all wiring lengths can be minimized in a logic circuit design by grasping the placement cells in a given level and the placement of ports enabling connection to cells in another level. The placement of cells in all levels does not need to be grasped, even when a logic circuit has multiple levels in order to simplify the logic design and the logic circuits in the lower levels have been black-boxed. As a result, the size of the IC substrate does not have to be increased due to physical constraints, and it is not necessary to verify the inter-cell wiring of all cells. The time required to perform the verification step can be reduced, and a logic circuit can be designed in less time.

This embodiment of the invention is not constrained either from the uppermost level or the lowest level. Thus, a logic design can be created in either descending order or ascending order.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A wiring method executable by a device, wherein the method assists in designing a logic circuit having a plurality of levels and able to minimize a sum total of wire lengths, the method comprising:
   placing, by a computer, cells of all levels of the logic circuit in placement areas within a grid, wherein the placement areas comprise blocks of the grid;
   placing, by the computer, a port at a first of the levels that enables a connection to an already placed cell in another of the levels, wherein the port is placed in a boundary portion between one of the placement areas of the grid having the already placed cell, and another one of the placement areas of the grid enabling new cells to be placed;
   wiring, by the computer, cells in a same one of the levels between cells; and
   wiring, by the computer, cells in the first of the levels to the already placed cell in the another level between the cells in the first level and the port.

2. The method of claim 1, wherein the placement area having the already placed cell is stored as an area not enabling placement of new cells.

3. The method of claim 1, wherein:
   the process for placing and wiring cells and ports in each level exchanges data with other processes via inter-process communication; and
   the method further comprises determining whether or not the placement area for placement of cells in a given level is a placement area enabling placement of new cells based on whether or not there is another process for placing cells in a same placement area.

4. The wiring method of claim 1, wherein the method further comprises determining that the sum total of the wiring lengths is minimized based on the placement of cells in a single one of the levels and the placement of the port.

5. The method of claim 1, wherein the placing the port in the boundary portion comprises placing the port in the boundary portion as a virtual object having no surface area such that the port does not interfere with the placement of the new cells on the grid.

6. A device for assisting in a design of a logic circuit having a plurality of levels comprising:
   placement means for placing cells of all levels of the logic circuit in placement areas within a grid, wherein the placement areas comprise blocks of the grid;
   port placing means for placing a port at a first of the levels that enables a connection to an already placed cell in another of the levels in a boundary portion between one of the placement areas of the grid having the already placed cell, and another one of the placement enabling placement new cells to be placed; and
   wiring means for wiring cells in a same one of the levels between cells, and wiring cells in the first of the levels to the already placed cell in the another level between the cells in the first level and the port, the wiring means wiring so that a sum total of the wiring lengths is minimized.

7. The device of claim 6, wherein the placement area having the already placed cell is stored as an area not enabling placement of new cells.

8. The device of claim 6, wherein:
   the placement means and wiring means for wiring cells and ports in each level exchanges data with other processes via inter-process communication; and
   the placement means and wiring means determines whether or not the placement area for placement of cells in a given level is a placement area enabling placement of new cells, based on whether or not there is a process for placing cells in a same placement area.

9. The device of claim 6, wherein wiring means determines that that the sum total of the wiring lengths is minimized based on the placement of cells in a single one of the levels and the placement of the port.

10. The device of claim 6, the port is a virtual object having no surface area such that the port does not interfere with the placement of the new cells on the grid.

11. A computer program product for designing a logic circuit having a plurality of levels, the computer program product comprising a computer readable hardware storage device having program instructions embodied therewith, the program instructions executable by a device to cause the device to:
   place cells of all levels of the logic circuit in placement areas within a grid, wherein the placement areas comprise blocks of the grid;
   place a port at a first of the levels that enables a connection to an already placed cell in another of the levels, wherein the port is placed in a boundary portion between the placement areas of the grid having the already placed cell, and another one of the placement areas of the grid enabling of new cells to be placed;
   wire cells in a same one of the levels between cells; and
   wiring cells in the first of the levels to the already placed cell in the another level between the cells in the first level and the port,
   wherein a sum total of the wiring lengths is minimized.

12. The computer program product of claim 11, wherein the program instructions cause the device to store a placement area having the already placed cell as an area not enabling placement of new cells.

13. The computer program of claim 11, wherein the program instructions cause the device to:
   exchange data with other processes via inter-process communication in the device; and
   determine whether or not the placement area for placement of cells in a given level is a placement area enabling placement of new cells based on whether or not there is a process for placing cells in a same placement area.

14. The computer program product of claim 11, wherein the program instructions cause the device to determine that that the sum total of the wiring lengths is minimized based on the placement of cells in a single one of the levels and the placement of the port.

15. The computer program product of claim 11, wherein the program instructions cause the device to place the port in the boundary portion as a virtual object having no surface area such that the port does not interfere with the placement of the new cells on the grid.

* * * * *